United States Patent
Fornara et al.

(10) Patent No.: US 8,618,821 B2
(45) Date of Patent: Dec. 31, 2013

(54) DEVICE FOR DETECTING THE THINNING DOWN OF THE SUBSTRATE OF AN INTEGRATED CIRCUIT CHIP

(75) Inventors: Pascal Fornara, Pourrieres (FR); Christian Rivero, Luynes (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 659 days.

(21) Appl. No.: 12/797,897

(22) Filed: Jun. 10, 2010

(65) Prior Publication Data

US 2010/0315108 A1    Dec. 16, 2010

(30) Foreign Application Priority Data

Jun. 15, 2009 (FR) ..................... 09 53968

(51) Int. Cl.
*G01R 27/08* (2006.01)

(52) U.S. Cl.
USPC ........... 324/706; 324/705; 324/725; 324/525; 324/526; 257/48; 257/E23.141; 73/754; 73/777; 73/774; 438/48

(58) Field of Classification Search
USPC ........... 324/706, 705, 725, 525, 526, 657, 98; 438/382–385
See application file for complete search history.

(56) References Cited

U.S. PATENT DOCUMENTS

| | | | |
|---|---|---|---|
| 3,961,900 A * | 6/1976 | Gintella et al. | 422/96 |
| 4,016,644 A | 4/1977 | Kurtz | |
| 4,618,397 A * | 10/1986 | Shimizu et al. | 438/53 |
| 5,060,261 A | 10/1991 | Avenier | |
| 7,490,522 B2 * | 2/2009 | Ruehrig et al. | 73/862.335 |
| 7,992,448 B2 * | 8/2011 | Shimazu et al. | 73/777 |
| 2002/0017138 A1 * | 2/2002 | Ueyanagi et al. | 73/514.33 |
| 2006/0043508 A1 * | 3/2006 | Ohta et al. | 257/417 |
| 2007/0228500 A1 * | 10/2007 | Shimazu et al. | 257/417 |
| 2008/0278217 A1 * | 11/2008 | Hankhofer et al. | 327/509 |
| 2008/0286944 A1 | 11/2008 | Thill | |
| 2009/0007686 A1 * | 1/2009 | Sumigawa et al. | 73/777 |
| 2010/0181999 A1 * | 7/2010 | Sudai et al. | 324/239 |
| 2010/0187527 A1 * | 7/2010 | Van Geloven et al. | 257/48 |

OTHER PUBLICATIONS

French Search Report dated Jan. 21, 2010 from corresponding French Application No. 09/53968 filed Jun. 15, 2009.
Jeffrey C Suhling et al:, *Silicon Piezoresistive Stress Sensors and Their Application in Electronic Packaging*, IEEE Sensors Journal, IEEE Service Center, New York, NY, US, vol. 1, No. 1, Jun. 1 2001, pp. 14-30, XP011055568.
Kasbari M et al:, *Embedded Stress Sensors for Strained Technologies Process Control*, IEEE Transactions on Semiconductor Manufacturing, IEEE Service Center, PIS Cataway, NJ, US, vol. 21, No. 3, Aug. 1, 2008, pp. 352-357, XP011232426.
Kanda Y: *A Graphical Representation of the Piezoresistance Coefficients in Silicon*, IEEE Transactions on Electron Devices, IEEE Service Center, Pisacataway, NJ, US, vol. ED-29, No. 1, Jan. 1, 1982, pp. 64-70, XP000673850.

* cited by examiner

*Primary Examiner* — Arleen M Vazquez
*Assistant Examiner* — Thang Le
(74) *Attorney, Agent, or Firm* — Wolf, Greenfield & Sacks, P.C.

(57) ABSTRACT

A device for detecting the thinning down of the substrate of an integrated circuit chip, including, in the active area of the substrate, bar-shaped diffused resistors connected as a Wheatstone bridge, wherein: first opposite resistors of the bridge are oriented along a first direction; the second opposite resistors of the bridge are oriented along a second direction; and the first and second directions are such that a thinning down of the substrate causes a variation of the imbalance value of the bridge.

22 Claims, 3 Drawing Sheets

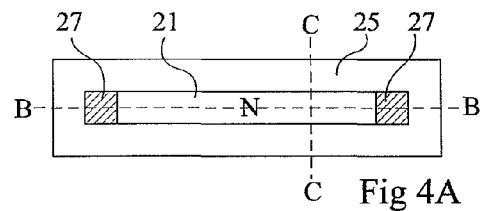
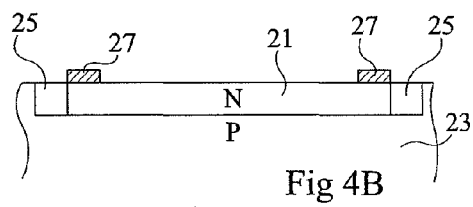
Fig 4A    Fig 4B
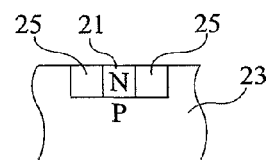
Fig 4C
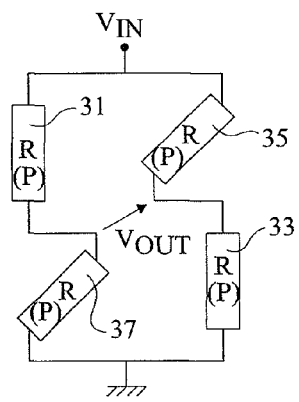
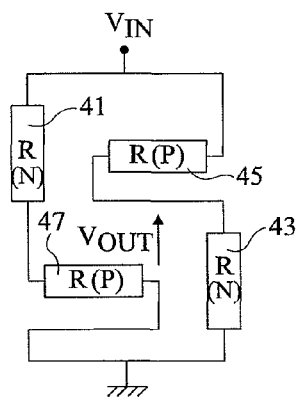
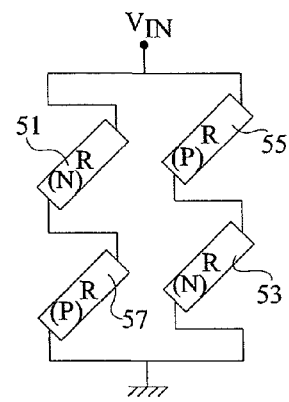
Fig 5         Fig 6         Fig 7

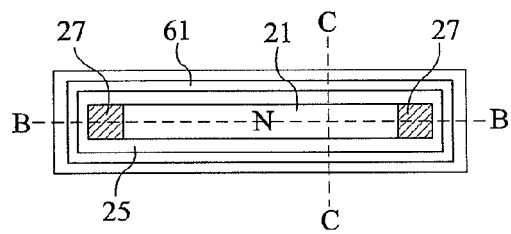
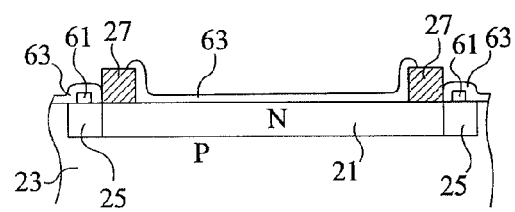
Fig 8A     Fig 8B
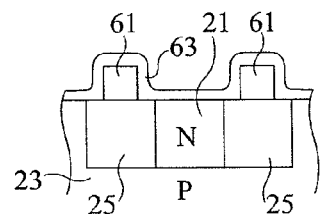
Fig 8C
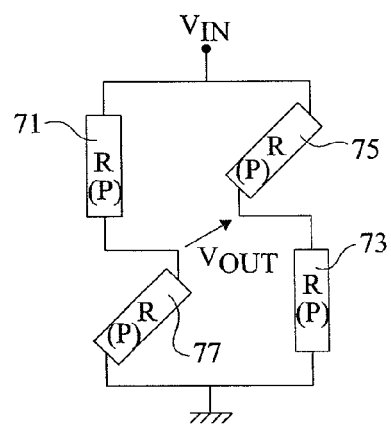
Fig 9

DEVICE FOR DETECTING THE THINNING DOWN OF THE SUBSTRATE OF AN INTEGRATED CIRCUIT CHIP

CROSS REFERENCE TO RELATED APPLICATIONS

This application claims the priority benefit of French patent application number 09/53968, filed on Jun. 15, 2009, entitled "DEVICE FOR DETECTING THE THINNING DOWN OF THE SUBSTRATE OF AN INTEGRATED CIRCUIT CHIP," which is hereby incorporated by reference to the maximum extent allowable by law.

BACKGROUND OF THE INVENTION

1. Field of the Invention

The present invention relates to the protection of an integrated circuit chip against laser attacks. It more specifically aims at the detection of the thinning down of the chip substrate which is carried out before performing a laser attack.

2. Discussion of the Related Art

FIG. 1 is a simplified cross-section view of an integrated circuit chip 1 comprising a semiconductor support substrate 3, comprising in its upper portion an active layer 5 in which are formed electronic components, not shown. Substrate 3 is currently covered with a stack of insulating layers 7. Conductive interconnection tracks 9 are formed between insulating layers. There generally exist several successive interconnection levels, for example, three, M1 to M3, in the shown example. Conductive vias, not shown, cross the insulating layers to connect the conductive tracks to one another, to input-output terminals 11 of the chip, and to components of active area 5, thus forming the circuit interconnects.

In secure devices, for example, payment cards, some regions of active area 5 are capable of processing and/or storing critical data, for example, ciphering keys. Such devices may be subject to fraudulent manipulations aiming at obtaining protected confidential data.

Among known attacks, so-called "fault attacks" comprise deliberately disturbing the operation of a chip, and analyzing the effect of the disturbances on its behavior. The attacker is especially interested in the influence of disturbances on data such as output signals, power consumption, or response times. He is likely to deduce therefrom, by statistical studies or others, critical data such as the algorithms used and possibly the ciphering keys. To deliberately cause faults in the circuits of a chip, an attack mode comprises bombarding areas of the chip with a laser beam. It is thus possible to inject faults into certain memory cells and/or to alter the operation of certain components. It should be noted that in a laser attack, the chip should be powered.

FIG. 2 is a simplified cross-section view of chip 1 of FIG. 1 illustrating a preliminary step where substrate 3 is thinned down, which is necessary to carry out a laser attack. To make the components of active region 5 accessible to the laser beam, the attacker needs to remove part of the thickness of support substrate 3. As an example, a chip formed from a substrate having a 180-µm thickness will have its thickness decreased by on the order of 150 µm before a laser attack.

To ensure protection against tampering, an attack detection device coupled to a protection circuit is generally provided in secure chips. When an attack is detected, the protection circuit implements measures of protection, alienation, or destruction of the critical data. For example, it may be provided, when an attack is detected, to interrupt the power supply of the chip or to reset it, in order to reduce the time for which the attacker can study the chip response to a disturbance.

Attack detection solutions may be logical. They, for example, comprise regularly introducing into the calculations integrity tests enabling to make sure that the data have not been modified from the outside. Such solutions have the disadvantage of introducing additional calculation steps, thus increasing the chip response times. Further, integrity tests cannot detect all the disturbances caused by an attacker. The latter thus has a leeway likely to enable him to acquire critical data.

Other so-called physical attack detection solutions especially comprise sensors sensitive to temperature variations, to ultraviolet rays, or to X rays, enabling to detect suspicious activities. Like logic solutions, such solutions are not perfectly reliable. Indeed, the attacker has a leeway before the attack has been detected, during which he may be able to obtain critical data. Further, such solutions are expensive and difficult to implement.

SUMMARY OF THE INVENTION

Thus, an object of an embodiment of the present invention is to provide a device for detecting a laser attack, which overcomes at least some of the disadvantages of prior art solutions.

An object of an embodiment of the present invention is to provide a device enabling to detect the attack before the attacker is able to analyze the chip response to laser disturbances.

An object of an embodiment of the present invention is to detect the thinning down of the chip support substrate, which is carried out before performing a laser attack.

An object of an embodiment of the present invention is to provide a low-cost solution, easy to implement with usual manufacturing methods.

Thus, an embodiment of the present invention provides a device for detecting the thinning down of the substrate of an integrated circuit chip, comprising, in the active area of the substrate, bar-shaped diffused resistors connected as a Wheatstone bridge, wherein: first opposite resistors of the bridge are oriented along a first direction; the second opposite resistors of the bridge are oriented along a second direction; and the first and second directions are such that a thinning down of the substrate causes a variation of the imbalance value of the bridge.

According to an embodiment of the present invention, the main surfaces of the substrate are in plane [001] of the crystal structure of the substrate.

According to an embodiment of the present invention: the diffused resistors are formed in a substrate region of a first conductivity type; and the first and second directions respectively correspond to directions (100) and (110) of the crystal structure of the substrate.

According to an embodiment of the present invention: the first opposite resistors are formed in a substrate region of a first conductivity type; said second opposite resistors are formed in a substrate region of the second conductivity type; and the first and second directions respectively correspond to directions (100) and (010) of the crystal structure of the substrate.

According to an embodiment of the present invention: the first opposite resistors are formed in a substrate region of a first conductivity type; the second opposite resistors are formed in a substrate region of the second conductivity type;

and the first and second directions are parallel to direction (110) of the crystal structure of the substrate.

According to an embodiment of the present invention: the diffused resistors are formed in a P-type doped substrate region; the first and second directions respectively correspond to directions (100) and (110) of the crystal structure of the substrate; and the second opposite resistors are each surrounded with an insulating region covered with a polysilicon layer, the entire resistor being covered with a protection nitride layer.

According to an embodiment of the present invention: the diffused resistors are formed in a N-type doped substrate region; the first and second directions respectively correspond to directions (100) and (110) of the crystal structure of the substrate; and the first opposite resistors are each surrounded with an insulating region covered with a polysilicon layer, the entire resistor being covered with a protection nitride layer.

Another embodiment of the present invention provides a circuit for detecting the thinning down of the substrate of an integrated circuit comprising: at least one device for detecting the thinning down of the substrate according to any of the above-mentioned embodiments; means for measuring the imbalance of this device.

According to an embodiment of the present invention, at least one comparator compares the imbalance value of said at least one device with a threshold, the output state of the detection circuit being based on the output value of this comparator.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 4A to 4C are simplified top and cross-section views showing an embodiment of a resistor;

FIGS. 5 to 7 are simplified top views of three embodiments of a device for detecting the thinning down of the substrate of a chip;

FIGS. 8A to 8C are simplified top and cross-section views showing an embodiment of a resistor; and FIG. 9 is a simplified top view showing another embodiment of a device for detecting the thinning down of the substrate of a chip.

DETAILED DESCRIPTION

Figure 1:
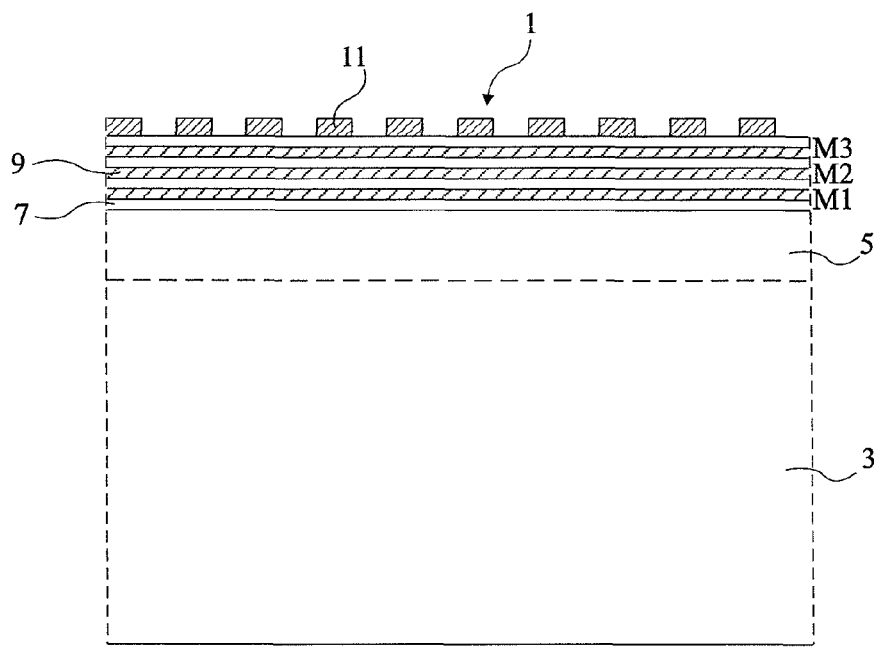
FIG. 1, previously described, is a simplified cross-section view of an integrated circuit chip portion.
Figure 2:
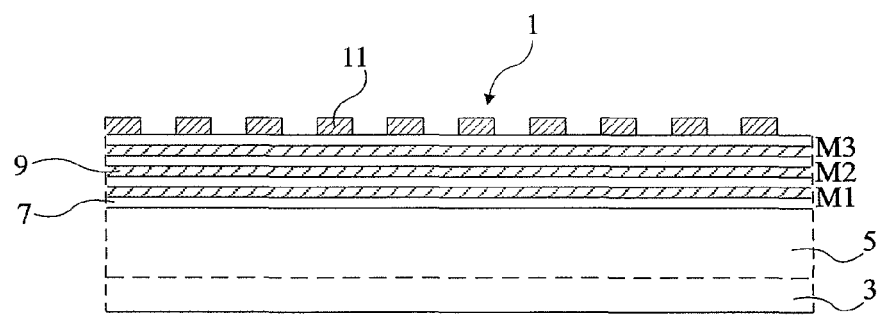
FIG. 2, previously described, is a simplified cross-section view of the chip portion of FIG. 1 after thinning down of its substrate.

For clarity, the same elements have been designated with the same reference numerals in the different drawings and, further, as usual in the representation of integrated circuits, the various cross-section and top views are not drawn to scale.

Figure 3:
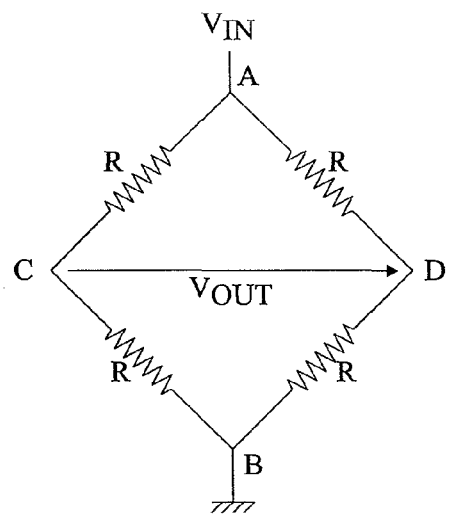
FIG. 3 shows the electric diagram of a Wheatstone bridge.

FIG. 3 shows the electric diagram of a Wheatstone bridge formed of four resistors, for example, of same value R. A first voltage $V_{IN}$ is applied to a first diagonal of the bridge, between nodes A and B. An imbalance voltage $V_{OUT}$ may appear across a second diagonal of the bridge, between nodes C and D.

Normally, the Wheatstone bridge is balanced and output voltage $V_{OUT}$ is independent from the value of $V_{IN}$ and from possible temperature variations, for example, close to 0 V.

FIG. 4A is a top view schematically showing an embodiment of a diffused resistor. FIGS. 4B and 4C are cross-section views of FIG. 4A along axes B-B and C-C. An N-type doped area 21 is formed in the upper portion of a region 23 of a lightly-doped P-type semiconductor substrate. In top view, area 21 has the shape of a rectangular bar. An oxide region 25 is arranged at the periphery of area 21 to delimit the resistor. Conductive pads 27 are arranged in contact with the ends of resistive area 21. All the above-mentioned conductivity types may be inverted.

The semiconductor substrate, typically made of silicon, has piezoresistive properties, that is, its conductibility varies according to the mechanical stress to which it is submitted. Now, the substrate thinning preceding a laser attack modifies the stress exerted in the active layer of the chip. Accordingly, the resistance value is likely to vary when the substrate is thinned down. Thus, to detect a thickness variation, it is here provided to detect a resistance variation.

FIG. 5 is a simplified top view of an embodiment of a device for detecting the thinning down of a chip substrate. This device, formed in the active chip area, comprises a Wheatstone bridge formed of four resistors 31, 33, 35, 37 of same value R. Resistors 31, 33, 35, 37 are diffused resistors, formed in a P-type semiconductor substrate, as described in relation with FIGS. 4A to 4C. A single-crystal silicon substrate having its main surface in a crystal plane [001], that is, a plane orthogonal to crystal direction (001), is here considered. Opposite resistors 31 and 33 are parallel to each other and are oriented, in Miller notation, along direction (100). Opposite resistors 35 and 37 are parallel to each other and are oriented along direction (110). Resistors 31, 33, 35, 37 are thus arranged in the same plane [001], directions (100) and (110) forming a 45° angle.

When the substrate is thinned down to be prepared for a laser attack, the stress variations in the active area are likely to affect resistors oriented along different directions differently. Resistors 31 and 33, oriented along axis (100), remain substantially unchanged. However, resistors 35 and 37, oriented along axis (110), undergo a significant variation. Thus, the thinning down of the substrate causes a variation in the imbalance value of the bridge. As an example, output voltage $V_{OUT}$ of the bridge varies by a factor 4 when 150 µm are removed from a 180-µm substrate (for example, from 20 mV to 80 mV).

If the four resistors were oriented along the same direction, the stress variations in the substrate would affect all resistors substantially in the same way in case of a thinning down of the substrate. The imbalance value of the Wheatstone bridge would thus remain unchanged.

If the resistors were formed in a semiconductor N-type substrate having its main surface also in a plane [001], the resistors oriented along a direction (110) would remain substantially unchanged in case of a thinning down of the substrate. However, the resistors oriented along a direction (100) would undergo a significant variation. Thus, the imbalance value of the bridge would be sensitive to the thinning down of the substrate.

At least one embodiment of the present invention also provides means, not shown, for measuring the imbalance value of the Wheatstone bridge. According to an embodiment, the measurement means comprise comparators comparing output voltage $V_{OUT}$ respectively with a positive threshold, for example 50 mV, and with a negative threshold, for example, 50 mV. When the bridge imbalance exceeds a threshold, the output of the substrate thinning-down detection circuit changes, thus for example stopping the chip operation. It may, for example, be chosen to perform the imbalance voltage measurements periodically, at each starting of the chip, or continuously, when the chip is powered.

FIG. 6 is a simplified top view of an alternative embodiment of a device for detecting the thinning down of a chip substrate. This device, formed in the active chip area, comprises a Wheatstone bridge formed of four resistors 41, 43, 45, 47, of same value R. Resistors 41, 43, 45, 47, are diffused resistors, formed as described in relation with FIGS. 4A to 4C in a substrate having its main surface formed in a plane [001]. Opposite resistors 41 and 43 are formed in a lightly-doped N-type region of the substrate. Resistors 41 and 43 are oriented, in Miller notation, along direction (100). Opposite resistors 45 and 47 are formed in a lightly-doped P-type substrate region. Resistors 45 and 47 are oriented along direction (010).

When the substrate is thinned down to be prepared for a laser attack, resistors 41 and 43, oriented along direction (100), undergo a significant variation. However, resistors 45 and 47, oriented along direction (010), remain substantially unchanged. Thus, the thinning down of the substrate causes a variation in the bridge imbalance value.

FIG. 7 is a simplified top view of an alternative embodiment of a device for detecting the thinning down of a chip substrate. This device, formed in the active chip area, comprises a Wheatstone bridge formed of four resistors 51, 53, 55, 57, of same value R. Resistors 51, 53, 55, 57 are diffused resistors formed as described in relation with FIGS. 4A to 4C in a substrate having its main surface in a plane [001]. Opposite resistors 51 and 53 are formed in a lightly-doped N-type substrate region. Opposite resistors 55 and 57 are formed in a lightly-doped P-type substrate region. Resistors 51, 53, 55, and 57 are oriented along direction (010).

When the substrate is thinned down to be prepared for a laser attack, resistors 51 and 53 undergo a significant variation. However, resistors 55 and 57 remain substantially unchanged. Thus, the thinning down of the substrate causes a variation of the imbalance value of the bridge.

Of course, the present invention is not limited to the configurations described in relation with FIGS. 5 to 7. It will be within the abilities of those skilled in the art to implement the desired operation by orienting the Wheatstone bridge resistors differently. However, to obtain good detection performances, the bridge should have a good sensitivity to stress variations generated by the substrate thinning-down. Generally, first opposite resistors of the bridge should be particularly sensitive to stress variations caused by the substrate thinning-down. However, the second opposite resistors of the bridge should remain substantially unchanged when the substrate is thinned down. The inventors have determined that the above-described configurations exhibit optimal detection performances for a [001] silicon substrate. Of course, if the main surface of the substrate is not in a plane [001], other orientations providing a maximum variability according to the stress likely to be created by a thinning down will be selected.

FIG. 8A is a top view schematically representing an embodiment of a diffused resistor, formed in the active layer of a chip. FIGS. 8B and 8C are cross-section views of the resistor of FIG. 8A along axes B-B and C-C. The resistor of FIGS. 8A to 8C is similar to the resistor of FIGS. 4A to 4C. It further comprises a polysilicon layer 61 on the surface of insulating region 25. Layer 61 corresponds to the maintaining on insulating region 25 of a portion of an insulated polysilicon layer, forming insulated gates of MOS transistors at other locations of the integrated circuit. Further, a protection nitride layer 63 may be maintained, to cover the entire resistor except for conductive pads 27.

FIG. 9 is a simplified top view of a device for detecting the thinning down of a chip substrate. This device comprises a Wheatstone bridge formed of four resistors 71, 73, 75, 77 of same value R, formed in a P-type semiconductor substrate having its main surface in a plane [001]. Opposite resistors 71 and 73 are diffused resistors formed as described in relation with FIGS. 4A to 4C. Opposite resistors 75 and 77 are diffused resistors having their insulation region covered with polysilicon, formed as described in relation with FIGS. 8A to 8C. Resistors 71 and 73 are oriented along direction (100). Resistors 75 and 77 are oriented along direction (110).

Such a device has improved substrate thinning down detection performance with respect to the device described in relation with FIG. 5. Indeed, the polysilicon and nitride layers present in resistors 75 and 77 amplify the sensitivity of these resistors to stress variations in the active area.

An advantage of the use of Wheatstone bridges as thinning-down detection elements lies in the fact that imbalance value $V_{OUT}$ is independent from the circuit temperature. Indeed, although the resistance values are likely to vary along with temperature, the undergone drift is the same for all the resistors of a same bridge, at least in the case where all resistors have the same doping type. Thus, the balancing remains unchanged.

According to an advantage of an embodiment of the present invention, the provided solution is compatible with usual manufacturing methods and requires no additional manufacturing steps.

Specific embodiments of the present invention have been described. Various alterations and modifications will occur to those skilled in the art. In particular, the present description mentions a circuit for detecting the thinning down of the substrate of a chip comprising a Wheatstone bridge and means for measuring the imbalance of this bridge. It will also be within the abilities of those skilled in the art to form a detection circuit comprising several Wheatstone bridges. Further, it will be within the abilities of those skilled in the art to implement the desired operation whatever the conductivity type of the semiconductor substrate in which the Wheatstone bridges resistors are formed. Further, the present invention is not restricted to the bridge imbalance detection means discussed in the present description. It will be within the abilities of those skilled in the art to implement the desired operation whatever the Wheatstone bridge imbalance measurement means used. Moreover, the present description mentions Wheatstone bridges formed of four resistors of same value. It will be within the abilities of those skilled in the art to implement the desired operation by using normally balanced Wheatstone bridges in which the resistors do not all have the same value.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for detecting a thinning down of a substrate of an integrated circuit chip, comprising, in an active area of the substrate, bar-shaped diffused resistors connected as a Wheatstone bridge, wherein:

first opposite resistors of the bridge are oriented along a first direction;

second opposite resistors of the bridge are oriented along a second direction; and said first and second directions are such that the thinning down of the substrate causes a variation of an imbalance value of the bridge, wherein the second opposite resistors vary in response to thinning of the substrate and the first opposite resistors are substantially unchanged in response to the thinning of the substrate and wherein an imbalance in the bridge is indicative of the thinning of the substrate.

2. The device for detecting the thinning down of the substrate of the integrated circuit chip of claim 1, wherein main surfaces of the substrate are in plane [001] of a crystal structure of the substrate.

3. The device for detecting the thinning down of the substrate of the integrated circuit chip of claim 2, wherein:

said diffused resistors are formed in a substrate region of a first conductivity type; and said first and second directions respectively correspond to directions (100) and (110) of the crystal structure of the substrate.

4. The device for detecting the thinning down of the substrate of an integrated circuit chip of claim 2, wherein:

said first opposite resistors are formed in a substrate region of a first conductivity type;

said second opposite resistors are formed in a substrate region of the second conductivity type; and said first and second directions respectively correspond to directions (100) and (010) of the crystal structure of the substrate.

5. The device for detecting the thinning down of the substrate of an integrated circuit chip of claim 2, wherein:

said first opposite resistors are formed in a substrate region of a first conductivity type;

said second opposite resistors are formed in a substrate region of the second conductivity type; and said first and second directions are parallel to direction (110) of the crystal structure of the substrate.

6. A device for detecting a thinning down of a substrate of an integrated circuit chip, comprising, in an active area of the substrate, bar-shaped diffused resistors connected as a Wheatstone bridge, wherein:

first opposite resistors of the bridge are oriented along a first direction;

second opposite resistors of the bridge are oriented along a second direction; and said first and second directions are such that the thinning down of the substrate causes a variation of an imbalance value of the bridge, wherein main surfaces of the substrate are in plane [001] of a crystal structure of the substrate, and wherein:

said diffused resistors are formed in a P-type doped substrate region;

said first and second directions respectively correspond to directions (100) and (110) of the crystal structure of the substrate; and said second opposite resistors are each surrounded with an insulating region covered with a polysilicon layer, the entire resistor being covered with a protection nitride layer.

7. The device for detecting the thinning down of the substrate of an integrated circuit chip of claim 2, wherein:

said diffused resistors are formed in a N-type doped substrate region;

said first and second directions respectively correspond to directions (100) and (110) of the crystal structure of the substrate; and said first opposite resistors are each surrounded with an insulating region covered with a polysilicon layer, the entire resistor being covered with a protection nitride layer.

8. A circuit for detecting the thinning down of the substrate of the integrated circuit chip comprising:

at least one device for detecting the thinning down of the substrate according to claim 1;

means for measuring the imbalance of said at least one device.

9. The circuit for detecting the thinning down of the substrate of the integrated circuit chip of claim 8, wherein at least one comparator compares the imbalance value of said at least one device with a threshold, the output state of the detection circuit being based on the output value of said at least one comparator.

10. A semiconductor device comprising:

a substrate; and a bridge circuit formed in the substrate, the bridge circuit comprising a first resistor connected between a voltage and a first node, a second resistor connected between the first node and ground, a third resistor connected between the voltage and a second node, and a fourth resistor connected between the second node and ground, wherein the first and fourth resistors vary in response to thinning of the substrate and the second and third resistors are substantially unchanged in response to the thinning of the substrate and wherein an imbalance in the bridge is indicative of thinning of the substrate.

11. The semiconductor device as defined in claim 10, wherein the first and fourth resistors are oriented along a first crystal direction of the substrate and the second and third resistors are oriented along a second crystal direction of the substrate.

12. A semiconductor device as defined in claim 10, wherein the first and fourth resistors are formed in a substrate region of a first conductivity type and the second and third resistors are formed in a substrate region of a second conductivity type.

13. The semiconductor device as defined in claim 10, wherein the first and fourth resistors are covered by polysilicon and nitride layers.

14. The semiconductor device as defined in claim 10, wherein the first, second, third and fourth resistors are bar-shaped diffused resistors.

15. The semiconductor device as defined in claim 14, wherein the first, second, third and fourth resistors each include a doped area and an oxide region at a periphery of the doped area.

16. The semiconductor device as defined in claim 15, wherein the first, second, third and fourth resistors each further include a polysilicon layer on a surface of the oxide region and a nitride layer over at least a portion of each resistor.

17. The semiconductor device as defined in claim 10, wherein the bridge circuit is sensitive to stress variations caused by thinning of the substrate.

18. The semiconductor device as defined in claim 10, wherein the substrate comprises a single crystal silicon substrate having a main surface in a crystal plane [001].

19. The semiconductor device as defined in claim 18, wherein the first and fourth resistors are formed in a substrate region of a first conductivity type and are oriented along a crystal direction (110) of the substrate, and wherein the second and third resistors are formed in a substrate region of the first conductivity type and are oriented along a crystal direction (100) of the substrate.

20. A semiconductor device as defined in claim 18, wherein the first and fourth resistors are formed in a substrate region of a first conductivity type and are oriented along a crystal direction (100) of the substrate, and wherein the second and third resistors are formed in a substrate region of a second conductivity type and are oriented along a crystal direction (010) of the substrate.

21. A semiconductor device as defined in claim 18, wherein the first and fourth resistors are formed in a substrate region of a first conductivity type and are oriented along a crystal direction (010) of the substrate, and wherein the second and third resistors are formed in a substrate region of a second conductivity type and are oriented along the crystal direction (010) of the substrate.

22. The semiconductor device as defined in claim 19, wherein the first and fourth resistors are diffused resistors covered by polysilicon and nitride layers.

\* \* \* \* \*